US008664712B2

(12) United States Patent
Mazure et al.

(10) Patent No.: US 8,664,712 B2
(45) Date of Patent: Mar. 4, 2014

(54) FLASH MEMORY CELL ON SEOI HAVING A SECOND CONTROL GATE BURIED UNDER THE INSULATING LAYER

(75) Inventors: Carlos Mazure, Bernin (FR); Richard Ferrant, Esquibien (FR)

(73) Assignee: Soitec, Bernin (FR)

( * ) Notice: Subject to any disclaimer, the term of this patent is extended or adjusted under 35 U.S.C. 154(b) by 674 days.

(21) Appl. No.: 12/946,135

(22) Filed: Nov. 15, 2010

(65) Prior Publication Data

US 2011/0134698 A1 Jun. 9, 2011

(30) Foreign Application Priority Data

Dec. 8, 2009 (FR) ...................................... 09 58746

(51) Int. Cl.
*H01L 29/66* (2006.01)
*H01L 29/788* (2006.01)
*H01L 27/12* (2006.01)
*H01L 21/336* (2006.01)
*H01L 21/3205* (2006.01)
*H01L 21/4763* (2006.01)

(52) U.S. Cl.
USPC .... 257/319; 257/318; 257/347; 257/E29.129; 257/E29.3; 257/E21.422; 257/E21.681; 438/257; 438/259; 438/593; 365/185.01; 365/185.18; 365/182; 365/184; 365/186

(58) Field of Classification Search
None
See application file for complete search history.

(56) References Cited

U.S. PATENT DOCUMENTS

| 4,169,233 A | 9/1979 | Haraszti .......................... 307/355 |
| 5,028,810 A | 7/1991 | Castro et al. ................... 307/201 |
| 5,146,426 A * | 9/1992 | Mukherjee et al. ............ 257/316 |
| 5,306,530 A | 4/1994 | Strongin et al. ............... 427/533 |
| 5,325,054 A | 6/1994 | Houston ......................... 324/158 |
| 5,455,791 A | 10/1995 | Zaleski et al. ............ 365/185.26 |
| 5,506,431 A * | 4/1996 | Thomas ..................... 365/185.15 |
| 5,557,231 A | 9/1996 | Yamaguchi et al. ........... 327/534 |

(Continued)

FOREIGN PATENT DOCUMENTS

| CN | 1716448 A | 1/2006 |
| EP | 1 081 748 A2 | 3/2001 |

(Continued)

OTHER PUBLICATIONS

U.S. Appl. No. 12/793,553, filed Jun. 3, 2010.

(Continued)

*Primary Examiner* — Hoang-Quan Ho
(74) *Attorney, Agent, or Firm* — Winston & Strawn LLP

(57) ABSTRACT

The invention relates to a flash memory cell having a FET transistor with a floating gate on a semiconductor-on-insulator (SOI) substrate composed of a thin film of semiconductor material separated from a base substrate by an insulating buried oxide (BOX) layer, The transistor has in the thin film, a channel, with two control gates, a front control gate located above the floating gate and separated from it by an inter-gate dielectric, and a back control gate located within the base substrate directly under the insulating (BOX) layer and separated from the channel by only the insulating (BOX) layer. The two control gates are designed to be used in combination to perform a cell programming operation. The invention also relates to a memory array made up of a plurality of memory cells according to the first aspect of the invention, which can be in an array of rows and columns, and a method of fabricating such memory cells and memory arrays.

17 Claims, 6 Drawing Sheets

(56) References Cited

U.S. PATENT DOCUMENTS

| | | | |
|---|---|---|---|
| 5,608,223 A | 3/1997 | Hirokawa et al. | 250/447.11 |
| 5,610,540 A | 3/1997 | Althoff et al. | 327/51 |
| 5,646,900 A | 7/1997 | Tsukude et al. | 365/205 |
| 5,753,923 A | 5/1998 | Mera et al. | 250/443.1 |
| 5,844,845 A | 12/1998 | Tahara | 365/189.05 |
| 5,869,872 A | 2/1999 | Asai et al. | 257/360 |
| 5,889,293 A | 3/1999 | Rutten et al. | 257/74 |
| 5,929,479 A * | 7/1999 | Oyama | 257/315 |
| 6,037,808 A | 3/2000 | Houston et al. | 327/55 |
| 6,043,536 A | 3/2000 | Numata et al. | 257/347 |
| 6,063,686 A | 5/2000 | Masuda et al. | 438/406 |
| 6,072,217 A | 6/2000 | Burr | 257/351 |
| 6,108,264 A | 8/2000 | Takahashi et al. | 365/230.03 |
| 6,141,269 A | 10/2000 | Shiomi et al. | 365/200 |
| 6,147,377 A * | 11/2000 | Liu | 257/314 |
| 6,300,218 B1 | 10/2001 | Cohen et al. | 438/423 |
| 6,317,360 B1 * | 11/2001 | Kanamori | 365/185.01 |
| 6,344,393 B1 * | 2/2002 | Liu | 438/259 |
| 6,372,600 B1 | 4/2002 | Desko et al. | 438/406 |
| 6,476,462 B2 | 11/2002 | Shimizu et al. | 257/627 |
| 6,498,057 B1 | 12/2002 | Christensen et al. | 438/149 |
| 6,611,023 B1 | 8/2003 | En et al. | 257/350 |
| 6,778,424 B2 * | 8/2004 | Iwata et al. | 365/149 |
| 6,825,524 B1 | 11/2004 | Ikehashi et al. | 257/314 |
| 6,965,143 B2 * | 11/2005 | Zheng et al. | 257/315 |
| 7,109,532 B1 | 9/2006 | Lee et al. | 257/133 |
| 7,112,997 B1 | 9/2006 | Liang et al. | 326/81 |
| 7,202,524 B2 * | 4/2007 | Kim et al. | 257/330 |
| 7,447,104 B2 | 11/2008 | Leung | 365/230.06 |
| 7,449,922 B1 | 11/2008 | Ricavy | 327/57 |
| 7,824,981 B2 * | 11/2010 | Wang | 438/261 |
| 7,973,364 B2 * | 7/2011 | Krivokapic | 257/347 |
| 8,058,118 B2 * | 11/2011 | Bhattacharyya | 438/197 |
| 8,223,582 B2 * | 7/2012 | Mazure et al. | 365/230.06 |
| 8,325,506 B2 * | 12/2012 | Mazure et al. | 365/49.1 |
| 8,358,552 B2 * | 1/2013 | Mazure et al. | 365/205 |
| 2001/0038299 A1 | 11/2001 | Afghahi et al. | 326/86 |
| 2001/0047506 A1 | 11/2001 | Houston | 716/4 |
| 2002/0105277 A1 | 8/2002 | Tomita et al. | 315/111.81 |
| 2002/0114191 A1 * | 8/2002 | Iwata et al. | 365/185.23 |
| 2002/0185684 A1 | 12/2002 | Campbell et al. | 257/347 |
| 2003/0001658 A1 | 1/2003 | Matsumoto | 327/534 |
| 2004/0108532 A1 | 6/2004 | Forbes | 257/296 |
| 2004/0146701 A1 | 7/2004 | Taguchi | 428/209 |
| 2004/0197970 A1 | 10/2004 | Komatsu | 438/163 |
| 2005/0077566 A1 * | 4/2005 | Zheng et al. | 257/315 |
| 2005/0110078 A1 | 5/2005 | Shino | 257/331 |
| 2005/0255666 A1 | 11/2005 | Yang | 438/401 |
| 2005/0276094 A1 | 12/2005 | Yamaoka et al. | 365/154 |
| 2006/0013428 A1 | 1/2006 | Sarin et al. | 365/49 |
| 2006/0013042 A1 | 1/2006 | Forbes et al. | 365/185.08 |
| 2006/0035450 A1 | 2/2006 | Frank et al. | 438/585 |
| 2006/0220085 A1 | 10/2006 | Huo et al. | 257/296 |
| 2006/0226463 A1 | 10/2006 | Forbes | 257/301 |
| 2006/0267064 A1 | 11/2006 | Rosner et al. | 257/304 |
| 2006/0284236 A1 * | 12/2006 | Bhattacharyya | 257/314 |
| 2006/0291321 A1 | 12/2006 | Leung | 365/230.06 |
| 2007/0029596 A1 | 2/2007 | Hazama | 257/296 |
| 2007/0029620 A1 | 2/2007 | Nowak | 257/369 |
| 2007/0063284 A1 | 3/2007 | Kawahara et al. | 257/351 |
| 2007/0075366 A1 | 4/2007 | Hamamoto | 257/347 |
| 2007/0076467 A1 | 4/2007 | Yamaoka et al. | 365/154 |
| 2007/0139072 A1 | 6/2007 | Yamaoka et al. | 326/33 |
| 2007/0152736 A1 | 7/2007 | Itoh et al. | 327/534 |
| 2007/0158583 A1 | 7/2007 | Cho | 250/440.11 |
| 2007/0171748 A1 | 7/2007 | Mukhopadhyay et al. | 365/208 |
| 2007/0230251 A1 | 10/2007 | Ajika et al. | |
| 2007/0241388 A1 | 10/2007 | Yamamoto et al. | 257/314 |
| 2007/0298549 A1 | 12/2007 | Jurczak et al. | 438/149 |
| 2008/0042187 A1 | 2/2008 | Hwang | 257/316 |
| 2008/0073698 A1 | 3/2008 | Ono | |
| 2008/0111199 A1 | 5/2008 | Kim et al. | 257/401 |
| 2008/0116939 A1 | 5/2008 | Takizawa | 326/103 |
| 2008/0144365 A1 | 6/2008 | Yamaoka et al. | 365/181 |
| 2008/0173916 A1 | 7/2008 | Nishihara | 257/298 |
| 2008/0203403 A1 | 8/2008 | Kawahara et al. | 257/80 |
| 2008/0251848 A1 | 10/2008 | Borot et al. | 257/365 |
| 2008/0253159 A1 | 10/2008 | Kajigaya | 365/51 |
| 2009/0003105 A1 | 1/2009 | Itoh et al. | 365/203 |
| 2009/0010056 A1 * | 1/2009 | Kuo et al. | 365/184 |
| 2009/0086535 A1 | 4/2009 | Ferrant et al. | 365/174 |
| 2009/0096011 A1 | 4/2009 | Hong et al. | 257/321 |
| 2009/0096936 A1 | 4/2009 | Hamada et al. | 348/731 |
| 2009/0101940 A1 * | 4/2009 | Barrows et al. | 257/204 |
| 2009/0111223 A1 | 4/2009 | Wiatr et al. | 438/155 |
| 2009/0121269 A1 | 5/2009 | Caillat et al. | 257/301 |
| 2009/0310431 A1 | 12/2009 | Saito | 365/207 |
| 2010/0032761 A1 | 2/2010 | Ding et al. | 257/350 |
| 2010/0035390 A1 | 2/2010 | Ding et al. | 438/152 |
| 2010/0079169 A1 | 4/2010 | Kim et al. | 326/120 |
| 2010/0117684 A1 | 5/2010 | Kim et al. | 326/120 |
| 2011/0134698 A1 * | 6/2011 | Mazure et al. | 365/185.18 |

FOREIGN PATENT DOCUMENTS

| | | |
|---|---|---|
| EP | 1 095 407 A1 | 5/2001 |
| EP | 1 199 745 A2 | 4/2002 |
| EP | 1 233 454 A2 | 8/2002 |
| EP | 1 357 603 A2 | 10/2003 |
| EP | 1 744 364 A2 | 1/2007 |
| FR | 2 925 223 | 6/2009 |
| JP | 64-88993 A | 4/1989 |
| JP | 04345064 A | 12/1992 |
| JP | 5-167073 A | 7/1993 |
| JP | 08255846 | 10/1996 |
| JP | 8-287692 A | 11/1996 |
| JP | 09232446 | 9/1997 |
| JP | 10125064 A | 5/1998 |
| JP | 2000196089 A | 7/2000 |
| JP | 2000-260887 A | 9/2000 |
| JP | 2002-353342 | 12/2002 |
| JP | 2004303499 | 10/2004 |
| JP | 2006-156925 A | 6/2006 |
| JP | 2008-004831 A | 1/2008 |
| JP | 2008-84956 | 4/2008 |
| TW | 472366 B | 1/2002 |
| TW | I243474 B | 11/2005 |
| WO | WO 99/66559 | 12/1999 |
| WO | WO 2007/060145 A1 | 5/2007 |
| WO | WO 2008/134688 A1 | 11/2008 |
| WO | WO 2009/013422 A2 | 1/2009 |
| WO | WO 2009/028065 A1 | 3/2009 |
| WO | WO 2009/077538 A2 | 6/2009 |
| WO | WO 2009/085865 A1 | 7/2009 |
| WO | WO 2009/104060 A1 | 8/2009 |
| WO | WO 2010/007478 A1 | 1/2010 |

OTHER PUBLICATIONS

U.S. Appl. No. 12/793,515, filed Jun. 3, 2010.
U.S. Appl. No. 12/789,100, filed May 27, 2010.
U.S. Appl. No. 12/886,421, filed Sep. 20, 2010.
U.S. Appl. No. 12/880,806, filed Sep. 13, 2010.
U.S. Appl. No. 12/898,230, filed Oct. 5, 2010.
U.S. Appl. No. 12/942,754, filed Nov. 9, 2010.
U.S. Appl. No. 12/961,293, filed Dec. 6, 2010.
U.S. Appl. No. 12/974,916, filed Dec. 21, 2010.
U.S. Appl. No. 12/974,822, filed Dec. 21, 2010.
U.S. Appl. No. 12/984,466, filed Jan. 4, 2011.
U.S. Appl. No. 13/007,483, filed Jan. 14, 2011.
U.S. Appl. No. 13/013,580, filed Jan. 25, 2011.
U.S. Appl. No. 13/039,167, filed Mar. 2, 2011.
European Search Report Application No. EP 09290838.3 dated Feb. 16, 2010.
European Search Report Application No. EP 10 29 0217 dated Sep. 15, 2010.
European Search Report Application No. EP 10290181.6 dated Jan. 14, 2011.
John Barth et al., "A 500MHz Random Cycle 1.5ns-Latency, SOI Embedded DRAM Macro Featuring a 3T Micro Sense Amplifier", ISSCC 2007/Session 27/DRAM and eRAM /27.1, IEEE International Solid-State Circuits Conference, Digest of Technical Papers, pp. 486-487 and p. 617 (2007).

(56) References Cited

OTHER PUBLICATIONS

John Barth et al., "A 45nm SOI Embedded DRAM Macro for POWER7™ 32MB On-Chip L3 Cache", ISSCC 2010/Session 19/High-Performance Embedded Memory/19.1, IEEE International Solid-State Circuits Conference, Digest of Technical Papers, pp. 342-344 (2010).
Paul Beckett, XP-002579039, "Performance Characteristics of a Nanoscale Double-gate Reconfigurable Array", Proc. of SPIE, vol. 7268, pp. 72680E-1-72680E-12 (2008).
I. Hassoune et al. "Double-gate MOSFET Based Reconfigurable Cells", The Institution of Engineering and Technology, Electronics Letters, vol. 43, No. 23, 3 pages (2007).
K. Cheng, et al., "Extremely Thin SOI (ETSOI) CMOS with Record Low Variability for Low Power System-on-Chip Applications", IBM Research at Albany Nanotech, pp. 3.2.1- 3.2.4( 2009).
P.J. Klim et al, "A 1 MB Cache Subsystem Prototype With 1.8 ns Embedded DRAMs in 45 nm SOI CMOS", IEEE, Journal of Solid-State Circuits, vol. 44, No. 4, pp. 1216-1226 (2009).
K. J. Kuhn, "Variation in 45nm and Implications for 32nm and Beyond", Intel, 2009 $2^{nd}$ International CMOS Variability Conference—London, pp. 1-86.
Choi Hoon, et al., XP-002579041, Improved Current Drivability With Back-Gate Bias for Elevated Source and Drain Structured FD-SOI SiGe MOSFET, Microelectronic Engineering, vol. 86, pp. 2165-2169 (2009).
D.E. Ioannou, et al. "Opposite-Channel-Based Injection of Hot-Carriers in SOI MOSFET's: Physics and Applications" IEEE Transactions on Electron Devices, vol. 45, No. 5, pp. 1147-1154 (1998).
K. Itoh, et al., "Impact of FD-SOI on Deep-Sub-100-nm CMOS LSIs—A View of Memory Designers" Central Research Laboratory, Tokyo, Japan, 2 pages.
R. Kaushik, et al. "Double-Gate SOI Devices for Low-Power and High-Performance Applications", IEEE Computer Society, The British Library, IEEE Xplore, 8 pages, (2006).
M. Mizukami, et al., "Depletion-type Cell-Transistor of 23 nm Cell Size on Partial SOI Substrate for NAND Flash Memory", Extended Abstracts of the 2009 International Conference on Solid State Devices and Materials, Sendai, pp. 865-866 (2009).
M. Matsumiya, et al., "A 15-ns 16-Mb CMOS SRAM With Interdigitated Bit-Line Architecture," IEEE Journal of Solid-State Circuits, vol. 27, No. 11, pp. 1497-1503 (1992).

S. Mukhopadhyay, et al., "A Novel High-Performance and Robust Sense Amplifier Using Independent Gate Control in Sub-50-nm Double-Gate MOSFET," IEEE Transactions on Very Large Scale Integration (VSLI) Systems, vol. 14, No. 2, pp. 183-192 (2006).
S. Mukhopadhyay, et al., "Design of High Performance Sense Amplifier Using Independent Gate Control in Sub-50nm Double-Gate MOSFET," Computer Society, Proceedings of the Sixth International Symposium on Quality Electronic Design (ISQED'05), The British Library, IEEE Xplore, 6 pages, (2010).
P. Nasalski, et al."An Innovative sub-32nm SRAM Voltage Sense Amplifier in Double-Gate CMOS Insensitive to Process Variations and Transistor Mismatch" The $15^{th}$ IEEE International Conference on Electronics, Circuits and Systems, pp. 554-557, (ICECS 2008).
P. Nasalski, et al."SRAM Voltage and Current Sense Amplifiers in sub-32nm Double-Gate CMOS Insensitive to Process Variations and Transistor Mismatch" IEEE, The British Library, IEEE Xplore, pp. 3170-3173 (2009).
T. Ohtou, et al. "Threshold-Voltage Control of AC Performance Degradation-Free FD SOI MOSFET With Extremely Thin BOX Using Variable Body-Factor Scheme", IEEE Transactions on Electron Devices, vol. 54, No. 2, pp. 301-307, ( 2007).
R. Tsuchiya, et al., "Silicon on Thin BOX: A New Paradigm of The CMOSFET for Low-Power and High-Performance Application Featuring Wide-Range Back-Bias Control" 2004 IEEE, 4 pages.
R. Tsuchiya, et al., "Controllable Inverter Delay and Suppressing $V_{th}$ Fluctuation Technology in Silicon on Thin BOX Featuring Dual Back-Gate Bias Architecture," Central Research Laboratory, Tokyo, Japan, IEEE, pp. 475-478 (2007).
Wilhelmus A. M. Van Noije, et al., XP-002579040, "Advanced CMOS Gate Array Architecture Combining "Gate Isolation" and Programmable Routing Channels," IEEE Journal of Solid-State Circuits, Special Papers, vol. SC-20, No. 2, pp. 469-480 (1985).
M. Yamaoka, et al., "SRAM Circuit With Expanded Operating Margin and Reduced Stand-By Leakage Current Using Thin-BOX FD-SOI Transistors," IEEE Journal of Solid-State Circuits, vol. 41, No. 11, pp. 2366-2372 (2006).
M. Yamaoka, et al., "Dynamic-Vt Dual-Power-Supply SRAM Cell using D2G-SOI for Low-Power SoC Application," IEEE International SOI conference, Oct. 2004, pp. 109-111 (2004).
Ulicki, Bob et al., "De-Myth-tifying" the SOI Floating Body Effect, SOI Industry Consortium, pp. 2-7 (2009).

* cited by examiner

FLASH MEMORY CELL ON SEOI HAVING A SECOND CONTROL GATE BURIED UNDER THE INSULATING LAYER

FIELD OF THE INVENTION

The present invention relates to the field of semiconductor devices, and more particularly to memory devices comprising a plurality of memory cells. The invention relates specifically to a flash-type memory cell on a semiconductor on insulator (SeOI) substrate formed by a field-effect transistor FET that has a floating gate. The invention also relates to a memory array comprising a plurality of memory cells of this type, and the methods of forming and controlling such flash memory cells.

BACKGROUND OF THE INVENTION

The structure of a Flash-type memory cell is generally similar to that of a conventional MOSFET transistor, except for the fact that the flash transistor has two gates instead of one. A top gate corresponds to the control gate of the transistor (as is the case for other MOS transistors), while another gate, the floating gate, is arranged between the control gate and the channel of the transistor. An inter-gate dielectric layer is arranged between the control gate and the floating gate, while a gate dielectric layer is arranged between the floating gate and the channel, so that the floating gate is fully insulated by these dielectric layers, and charges can be stored therein in a particularly durable manner.

The example of a NOR-type flash memory cell consisting of an NMOS transistor is described below. Such a cell is equivalent in its inactive state to a logic "1" because a current flows through the channel by applying an appropriate voltage to the control gate.

Such a memory cell can be programmed (to set it to the "0" logic state) by the following procedure that implements a hot electron injection phenomenon.

A very high voltage is applied to the control gate and to the drain. The channel is passing so that electrons flow from the source to the drain. The source-drain current is then sufficiently high for high-energy electrons (hot electrons resulting from the collision of the charges with the crystalline network of the channel) to reach the floating gate by passing through the gate dielectric layer.

These hot electrons are then trapped in the floating gate, which alters the threshold voltage of the transistor. This mechanism decreases the voltage in the floating gate, and increases the apparent threshold voltage of the transistor (so that a higher voltage must be applied to the control grate for the transistor to be able to be passing—ON state). However, in normal reading conditions, the coupling of the two gates is insufficient to render the transistor passing. The read current of a programmed memory cell is thus "0".

The cell can be erased (reset to the "1" logic state) by applying a low voltage to the control gate so that the transistor is not passing (OFF state), and whether it contained a "0" or "1" (that is to say, whether it was programmed or not) is unimportant. A very high voltage is applied to the drain so that a high voltage, of opposite polarity to that implemented in programming, is thus applied between the control gate and the source. The electrical field between the two gates increases until electrons can escape from the floating gate through the gate dielectric layer by tunnel effect.

During this erasure operation, the floating gate voltage decreases and the apparent threshold voltage of the transistor decreases.

In order to read the cell, a nominal read voltage VDD is applied to the control gate. Depending on the status of the memory cell (programmed or erased), the transistor is either passing (ON state if it is erased) or blocked (OFF state if it is programmed).

A positive voltage is also applied to the drain (any value below VDD to avoid disturbances while obtaining an adequate read signal). The drain will then be discharged if the transistor is ON. An analysis amplifier can then read either the current or the voltage drop.

Such flash memory cells have the drawback that a very high voltage must be applied to the control gate during programming operations to generate the hot electrons capable of reaching the floating gate through the gate dielectric layer.

As it happens, such high programming voltages are undesirable in as much as they increase the complexity of the design of the peripheral circuits (dedicated circuitry implementing charge pumps is in particular necessary to generate these high voltages), they are likely to damage the cell and even disrupt the operation of nearby memory cells.

U.S. Pat. No. 5,455,791A describes a EEPROM device fabricated on a SOI substrate having a back semiconducting layer and a front semiconducting layer separated by a buried insulating layer. The EEPROM device comprises two separate control gates, a front control gate and a back control gate. The back control gate is formed by the back semiconducting layer and a back gate contact made of a conductive material that extends all over the back semiconducting layer and is separated from the buried insulating layer by the back semiconducting layer. The back control gate is not suitable to be used for performing a programming operation because of the distance separating the back gate contact from the channel region.

There is a need to resolve these problems of design complexity regarding the peripheral circuits and of reliability of the cell and of the circuit in general and that need is now satisfied by the present invention.

SUMMARY OF THE INVENTION

The invention generally relates to a flash memory cell having a FET transistor with a floating gate on a semiconductor-on-insulator (SOI) substrate composed of a thin film of semiconductor material separated from a base substrate by an insulating buried oxide (BOX) layer, the transistor having, in the thin film, a channel, with two control gates, a front control gate located above the floating gate and separated from it by an inter-gate dielectric, and a back control gate located within the base substrate directly under the insulating (BOX) layer and separated from the channel by only the insulating (BOX) layer, with the two control gates being designed to be used in combination to perform a cell programming operation. The invention also relates to a memory array made up of a plurality of memory cells according to the first aspect of the invention, and may include DRAM memory cells, which can be in an array of rows and columns, as well as a method of fabricating such memory cells and arrays.

The present invention relates to a Flash memory cell that comprises an insulating layer on a base substrate, a thin film layer of semiconductor material on the insulating layer to form a semiconductor-on-insulator (SOI) substrate, a channel in the thin film layer, wherein the channel forms part of a field effect transistor (FET), a gate dielectric layer on the thin film layer above the channel, a floating gate on the gate dielectric layer, an inter-gate dielectric layer on the floating gate to thereby electrically isolate the floating gate, a front control gate on the inter-gate dielectric layer above the floating gate and separated therefrom by the inter-gate dielectric, and a back control gate within the base substrate directly under and adjacent the insulating layer, wherein the front and back control gates are designed to be used in combination to perform a cell programming operation. The memory cell can also further comprise a source region and a drain region in the thin film layer. In a preferred embodiment, the channel of the FET is fully depleted, although the channel may only be partially depleted.

In a preferred embodiment of the memory cell the back control gate extends under the entire width of the memory cell. The back control gate may also be located in such a way as to extend only facing the floating gate. The polarity of the back control gate of the present memory cell can also be of the same type as the channel of the FET, and the back control gate mat also be insulated in the base substrate by a well of opposite bias.

The insulating layer of the SOI substrate can be a $SiO_2$ buried oxide (BOX) layer, or in another embodiment it may be comprised of a layer of $Si_3N_4$ sandwiched between two layers of $SiO_2$.

In another embodiment of the memory cell, a trench can be formed within the channel, and the gate dielectric layer is formed on the walls of the trench. The floating gate is formed in the trench on the gate dielectric layer, so as to be electrically isolated from the channel. The source region and drain region in the thin film layer can be arranged asymmetrically on either side of the floating gate formed in the trench, so that the drain region is closer to the floating gate than is the source region.

Another aspect of the invention, is an array of memory cells having any of the structures described above, with a plurality of memory cells arranged in rows and in columns, and in which a back gate line is coupled to the back control gate of each of the cells along a row or a column. The array of memory cells can have the word line coupled to the front control gate of each of the plurality of memory cells along a column, and in which the back gate line extends parallel to the word line.

The present invention also includes having an array of memory cells with a first set of memory cells having floating gates, and a second set of memory cells that are memory cells having channels recessed in the thin film and control gates recessed in the channel. This array of memory cells can include a first subset of the plurality of memory cells that are FET memory cells that are fully depleted or that otherwise have a structure as described herein and a second subset of memory cells that are DRAM memory cells with floating channels and control gates recessed in the channel.

The present invention also relates to a method of fabricating a flash memory cell comprising forming an insulating layer on a base substrate, wherein the insulating layer can be a silicon oxide layer ($SiO_2$) or a silicon nitride layer ($Si_3N_4$) sandwiched between two silicon oxide layers ($SiO_2$), forming a thin film layer of semiconductor material on the insulating layer to form a semiconductor-on-insulator substrate, forming a channel in the thin film layer, wherein the channel forms part of a field effect transistor (FET), forming a gate dielectric layer on the thin film layer above the channel, forming a floating gate on the gate dielectric layer, forming an inter-gate dielectric layer on the floating gate to thereby electrically isolate the floating gate, forming a front control gate on the inter-gate dielectric layer above the floating gate and separated therefrom by the inter-gate dielectric, and forming a back control gate within the base substrate directly under and adjacent the insulating layer, wherein the front and back control gates are designed to be used in combination to perform a cell programming operation.

The present invention also relates to a method of fabricating a memory array having FETs as described above, and DRAM memory cells.

The method of fabricating a memory array made of a plurality of FETs and DRAM cells comprises forming an insulating layer on a base substrate; forming a thin film layer of semiconductor material on the insulating layer to form a semiconductor-on-insulator (SOI) substrate; forming a plurality of channels in the thin film layer, wherein each of the plurality of channels forms part of a memory cell in an array; forming a trench in each of the plurality of channels created in the thin film layer; forming a gate dielectric layer on the walls of each of the plurality of trenches; forming a gate in each of the plurality of trenches on the gate dielectric layer by filling the trench with a gate material; forming the inter-gate dielectric layer on a first subset of the plurality of the floating gates; forming the front control gate on the inter-gate dielectric layer, for each of the cells of the first subset to thereby create a plurality of FET memory cells having floating gates; and forming the front control gate directly on the gate material filling a second subset of trenches, different from the first subset, to create a plurality of DRAM memory cells having floating channels.

The array of memory cells can also further comprise a source region and a drain region in the thin film layer, wherein the source region is shared between two adjacent memory cells along either a row or a column within the array.

The invention also relates to a method of controlling a memory cell, as described above, in which, during a cell programming operation, the front control gate and the back control gate are used in combination by applying a first positive voltage to the front control gate and a second positive voltage to the back control gate, such that the first voltage is less than the voltage needed to program the memory cell compared to when no voltage is applied to the back control gate.

To summarize, some preferred but non-limiting aspects of this memory cell include: the back control gate extends under the entire width of the memory cell; the back control gate is located in such a way as to extend only facing the floating gate; the polarity of the back control gate is of the same type as that of the channel of the transistor; the back control gate is insulated in the base substrate by a well of opposite bias; the memory cell also comprises insulating regions extending depthwise into the base substrate to insulate the back control gate; the memory cell is of the fully depleted type; the floating gate is arranged on the surface of the thin film and is insulated from the channel in the thin film via a gate dielectric layer; the floating gate is formed in a trench made in the channel, and insulated from the channel via a gate dielectric layer arranged on the walls of the trench; the FET transistor comprises a source region and a drain region that are arranged asymmetrically in the thin film on either side of the floating gate formed in the channel so that the drain region is closer to the floating gate than the source region is.

BRIEF DESCRIPTION OF THE DRAWINGS

Other aspects, aims and advantages of the present invention will become more apparent from reading the following detailed description of preferred embodiments thereof, given as non-limiting examples, and with reference to the appended drawings in which.

DETAILED DESCRIPTION OF THE INVENTION

Figure 1:
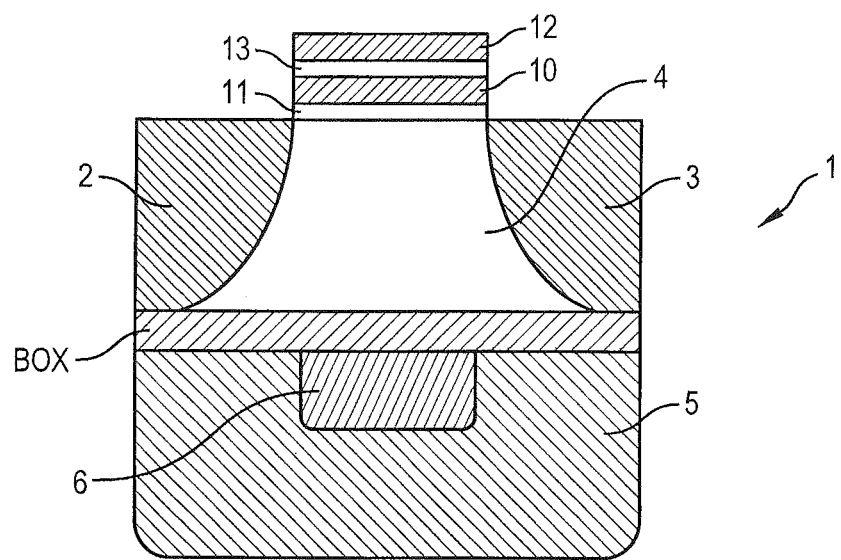
FIG. 1 represents one possible embodiment of a fully depleted planar flash memory cell according to the invention.

The present invention, according to a first aspect, relates to a flash memory cell comprising a FET transistor with a floating gate on a semiconductor-on-insulator (SOI) substrate comprising a thin film of semiconductor material separated from a base substrate by an insulating layer, the transistor having, in the thin film, a channel, characterized in that it comprises two control gates, a front control gate being arranged above the floating gate and separated therefrom by an inter-gate dielectric and a back control gate being arranged within the base substrate directly under the insulating layer so as to be separated from the channel only by the insulating layer, the two control gates being designed to be used in combination to perform a cell programming operation.

According to another aspect, the invention relates to a memory array comprising a plurality of memory cells according to the first aspect of the invention arranged in rows and in columns, in which a back gate line is coupled to the back control gate of each of the memory cells along a row or a column.

A word line can be coupled to the front control gate of each of the cells along a column, the back gate line extending in parallel to the word line.

According to yet another aspect, the invention relates to a memory array comprising a plurality of memory cells arranged in rows and in columns, in which a first set of memory cells comprises flash cells with a floating gate recessed in the channel in accordance with the first aspect of the invention, and a second set of memory cells comprises DRAM cells with a floating channel, and control gate recessed in the channel.

According to yet another aspect, the invention relates to a method of fabricating a memory array comprising a first set of flash memory cells with the floating gate recessed in the channel that conform to the first aspect of the invention and a second set of DRAM memory cells with a floating channel and control gate recessed in the channel.

The method of forming a FET flash memory cell differs from the method of forming a dynamic random access memory (DRAM) cell after the first series of steps of creating a trench in the thin semiconductor film layer, coating of the walls of the trench with a dielectric layer, filling the trench with the gate material. To form a FET memory cell, the first series of steps is followed by forming the inter-gate dielectric layer on the trench and forming the front control gate on the inter-gate dielectric layer to create a floating gate. In contrast, a DRAM cell is produced by the formation of a control gate directly on the trench to create a floating channel, but without a floating gate.

The invention also extends to a method of controlling a memory cell according to the first aspect of the invention, in which, during a cell programming operation, the front control gate and the back control gate are used in combination by applying a first positive voltage to the front control gate and a second positive voltage to the back control gate, said first voltage being less than the voltage needed to program the cell when no voltage is applied to the back control gate.

Non-limiting examples of the different aspects and embodiments of the invention will now be described in reference to the figures.

Referring to FIG. 1, a flash memory cell 1 is represented, comprising an FET transistor with floating gate on a semiconductor on insulator substrate comprising a thin film of semiconductor material separated from a base substrate 5 by an insulating layer, typically a buried oxide BOX layer.

The semiconductor on insulator substrate is, for example, a silicon on insulator (SOI) substrate.

According to a preferred embodiment, the insulating layer is a layer of $SiO_2$. According to an advantageous variant, the insulating layer comprises a layer of $Si_3N_4$ sandwiched between two layers of $SiO_2$.

The transistor comprises, in the thin film, a source region 2, a drain region 3 and a channel 4 separating the source region 2 from the drain region 3.

In FIG. 1, the drain D and the source S are in contact with the buried oxide BOX layer so that the FET transistor is fully depleted. The channel of the memory cell is of the fully depleted type. It should be understood, however, that the invention is not limited to a fully depleted memory cell but also extends to a memory cell on partially depleted SeOI.

The source S can thus be shared between two adjacent memory cells (along a row of a memory array extending in the plane of FIG. 2a; the columns of the memory array extending perpendicularly to the plane of FIG. 2a. Such sharing means that the space occupied by a memory cell can be reduced.

Conventionally, as is known in the art, it is then necessary to insulate the cells along a row of the memory array in order to insulate the channels of adjacent cells from one another. This is conventionally done using insulating trenches (according to the STI—"shallow trench isolation"—technique) extending depthwise from the surface of the substrate to the BOX.

Referring to FIG. 1, the flash memory cell 1 comprises a floating gate 10 extending on the surface of the substrate above the channel 4. The floating gate 10 is insulated from the channel via a gate dielectric layer 11.

A front control gate 12 is arranged in a conventional manner that is known per se above the floating gate 10, an inter-gate dielectric layer 13 being interposed between the front control gate 12 and the floating gate 10.

The flash memory cell 1 also comprises a back control gate 6 arranged within the base substrate 5 directly under the insulating BOX layer, so as to be separated from the channel 4, only by the insulating BOX layer.

The memory cell thus has two control gates: the front control gate 12 used conventionally, and the back control gate 6 proposed by the invention which is in particular designed to be used in combination with the front control gate to perform a cell programming operation.

As a purely illustrative example, the thickness of the thin film of the semiconductor on insulator substrate is between 1.5 nm and 50 nm, the thickness of the insulating layer is between 1.5 nm and 50 nm.

Figure 2:
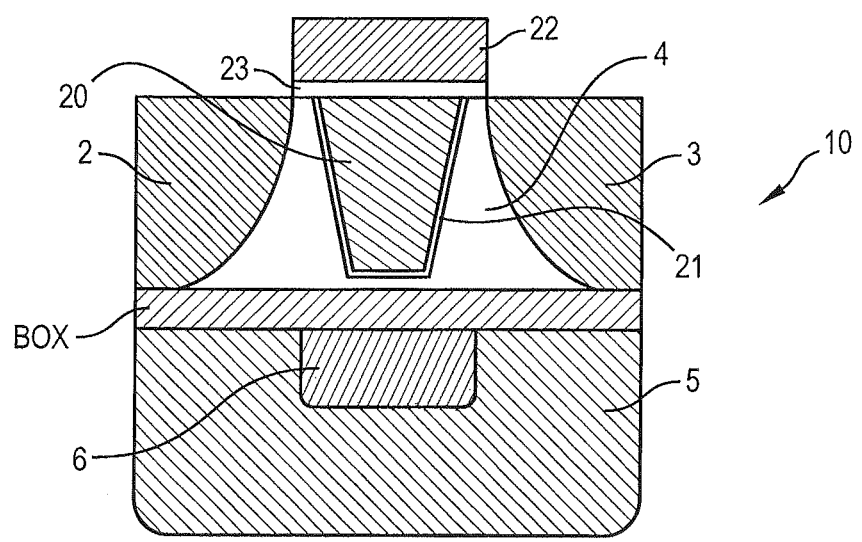
FIG. 2 represents one possible embodiment of a flash memory cell with fully depleted recessed floating gate according to the invention.

FIG. 2 illustrates another possible embodiment of a fully depleted flash memory cell 10 according to the invention, in which the floating gate is not arranged on the surface of the substrate, but is, on the contrary, embedded in the channel. The floating gate 20 in this case fills a trench formed in the thickness of the channel 4, a gate dielectric layer 21 being arranged on the walls of the trench so as to insulate the floating gate 20 from the channel 4.

This second embodiment is advantageous in that the back control gate 6 is then situated relatively close to the floating gate 20 recessed in the channel. This second embodiment thus allows greater thin film thicknesses, for example up to 300 nm. In each of the embodiments described hereinabove, the back control gate 6 increases the current flowing in the channel during a cell programming operation (the back control gate thus provides a boost effect).

Because the current is higher, the current density also increases since the dimensions of the flash transistor remain substantially minimal. Using the back control gate therefore makes it possible to obtain hot electrons at a lower voltage when programming. The programming voltages can thus be lowered, which considerably helps in the design of the peripheral circuits and strengthens the reliability of the memory cell and of the circuit in general.

As an illustrative example for the current technologies implemented in 2009, the programming is done with voltages of the order of 7 to 9V, erasure with voltages of the order of −4V to −6V. The invention overall makes it possible to lower by approximately 40% the voltages required for programming, and therefore to have roughly the same amplitudes for the programming and erasure operations.

It will be noted that, instead of lowering the programming voltages, it is possible to utilize programming voltages of the same amplitude. Use of the back control gate then makes it possible to reduce the time needed to carry out the programming which is of particular interest for a flash memory cell which is conventionally not very fast in write mode.

The polarity of the back control gate 6 is preferentially chosen so as to be of the same type as that of the channel of the transistor (or an N type polarity for an NPN-type transistor, a P type polarity for a PNP transistor). A threshold voltage of the bottom transistor is defined in such a way.

However, the invention also extends to a back gate that has a working voltage (polarity opposite to that of the FET transistor). In this particular case however, the threshold voltage of the transistor is increased and it is then necessary to apply a higher voltage to the back control gate in a cell programming operation.

According to one embodiment that is not represented, the source region and the drain region of the FET transistor are arranged asymmetrically in the thin film on either side of the floating gate formed in the channel so that the drain region is closer to the floating gate than the source region is.

A cell erasure operation can be modeled by two series coupling capacitors, one between the drain and the floating gate, the other between the floating gate and the front control gate. The floating gate voltage then follows the drain voltage according to a coupling that depends on the ratio between these coupling capacitors. By implementing an additional N− or N+ implant in the drain region so that it is closer to the floating gate than the source region is, the drain-floating gate coupling is increased. The electrical field between the front control gate and the floating gate then increases until, by tunnel effect, electrons pass from the floating gate to the front control gate.

FIGS. 3a-3k represent different steps of possible sequences in constructing and insulating a back control gate in the base substrate. These figures show both the case of a P type and an N type back control gate.

Figure 3A:
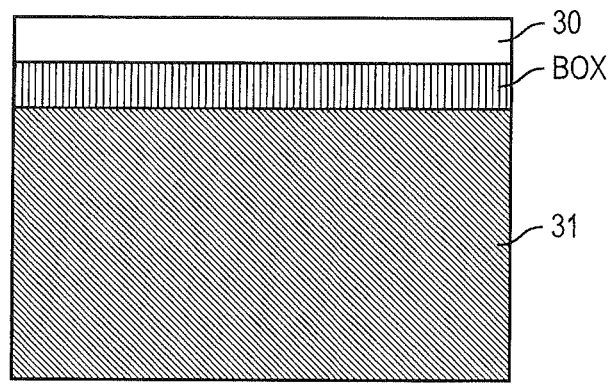
FIGS. 3a-3k illustrate different steps of sequences in forming and insulating a back control gate in the base substrate.

FIG. 3a represents an SeOI substrate comprising a thin film of semiconductor material 30 separated from a base substrate 31 by an insulating BOX layer.

In a first step, alignment marks are defined in the SeOI substrate so as to allow for the necessary alignment in later masking and pattern formation steps (formation of wells, back control gates, insulating structures, etc.).

This first substrate marking step thus comprises forming, in the substrate, a groove, a trench, a mesa, or any other sign (such as a cross for example).

Figure 3B:
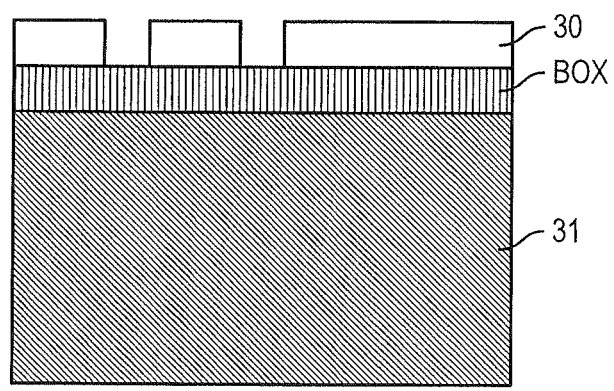

FIG. 3b to this end illustrates the formation of mesas by surface layer etching. For this, standard CMOS fabrication methods are used.

Figure 3C:
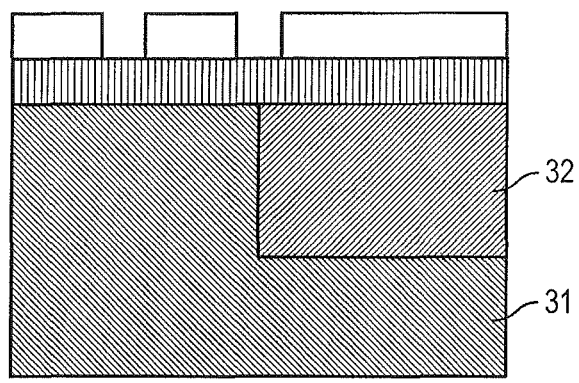
Figure 3D:
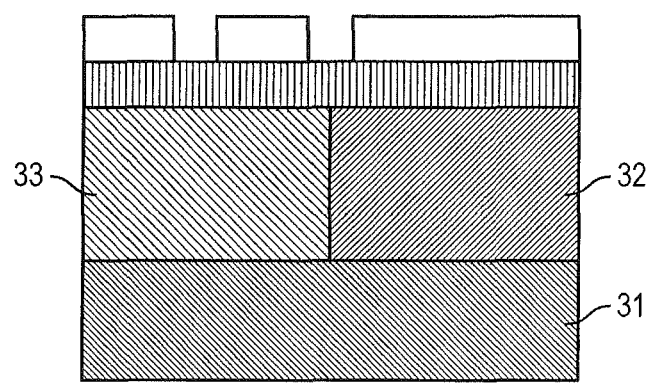
Figure 3E:
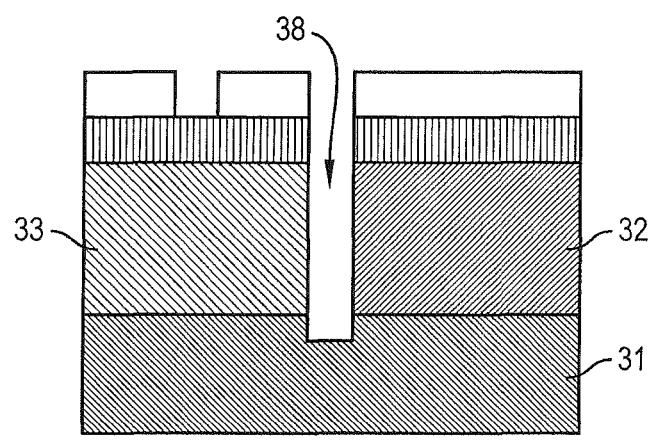

FIGS. 3c, 3d and 3e represent different possible approaches for the formation of "wells" buried under the insulating BOX layer, with a view to ultimately insulating one or more back control gates with respect to the base substrate 31.

In each of FIGS. 3c, 3d and 3e, the base substrate 31 is doped so as to exhibit, in a top layer thereof, an N-type conductivity. The doping level is typically between $1*10^{15}$ and $5*10^{16}$ cm$^{-3}$.

In FIG. 3c, a P-type well 32 has been produced, by dopant implantation, beneath the insulating BOX layer in the N-type base substrate 31. The P-type well 32 is thus insulated from the N-type substrate by a pn junction.

In FIG. 3d, both a P-type well 32 and an N-type well 33 have been produced. The wells 32, 33 are insulated from one another by a pn junction.

In FIG. 3e, both a P-type well 32 and an N-type well 33 have been produced, as in FIG. 3d. An STI-type insulating trench 38 has also been produced, extending, from the surface of the SeOI substrate, under the insulating BOX layer, depthwise in the base substrate 31, this trench providing the insulation between the wells 32, 33.

The doping level in the wells of FIGS. 3c, 3d and 3e is typically between $5*10^{16}$ and $5*10^{18}$ cm−3.

It will be noted that the steps needed to fabricate the structures represented in FIGS. 3c, 3d and 3e are based on standard CMOS fabrication methods.

Figure 3F:
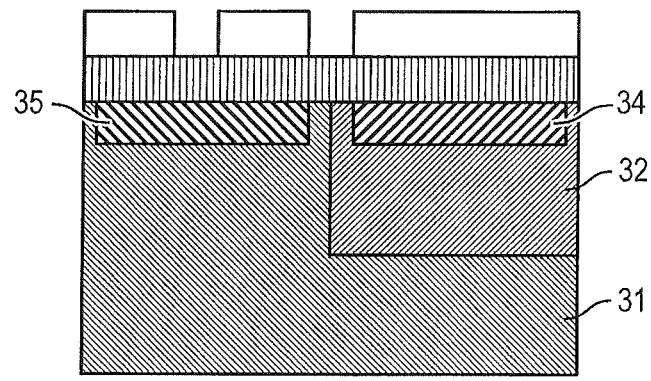
Figure 3G:
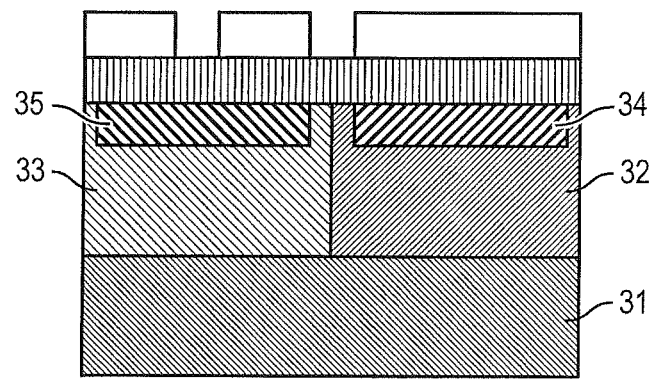
Figure 3H:
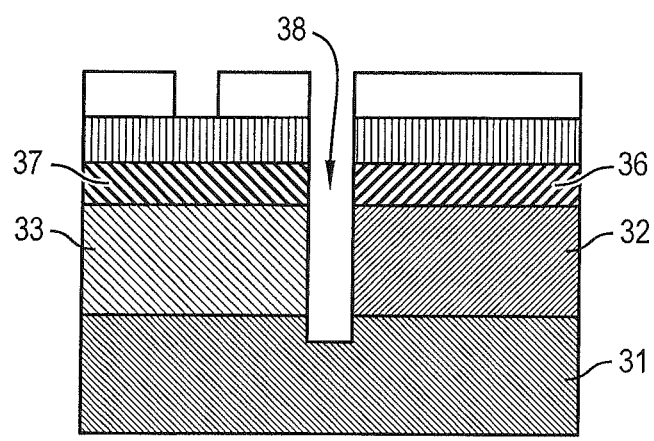
Figure 3I:
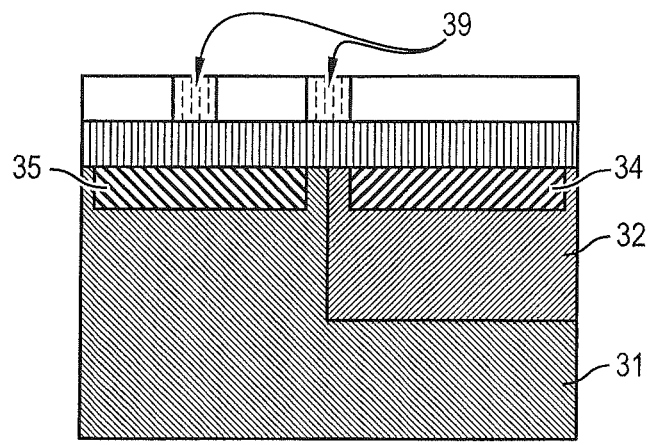
Figure 3J:
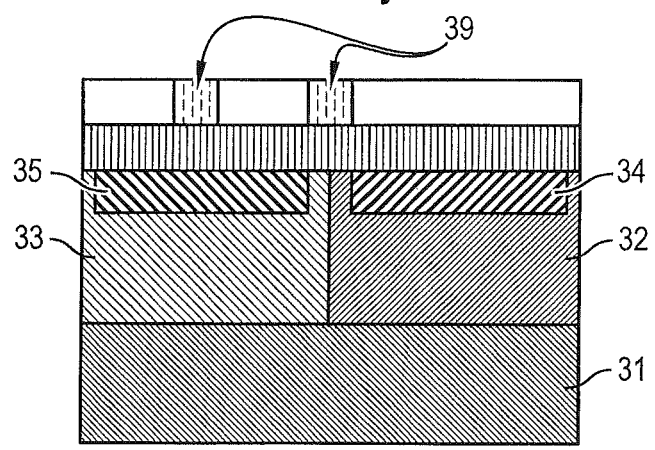
Figure 3K:
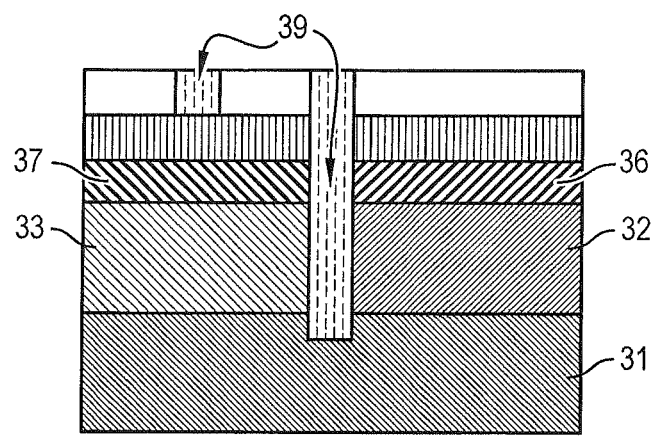

Starting from the structure represented in FIGS. 3c (respectively FIG. 3d and FIG. 3e), dopant implantation is then implemented in order to form back control gates 34, 35, 36, 37 within the base substrate, directly under the insulating BOX layer as represented in FIG. 3f (respectively FIG. 3g and FIG. 3h).

The doping level to form a back control gate is typically between $5*10^{18}$ and $5*10^{20}$ cm$^{-3}$.

As represented in FIGS. 3g and 3h, the back control gate 34, 35, 36, 37 is insulated from the base substrate 5 by a well 32, 33 of opposite bias (P-type well 32 for the N-type back control gate 34, 36; N-type well 33 for a P-type back control gate 35, 37).

In the case of FIG. 3f, a well has been produced solely for a single back control gate bias (P well 32 insulating an N back control gate 34, while a P-type back control gate 35 is arranged directly in the N-biased base substrate 31).

It will be noted that, generally, the well voltage is chosen so that the diode created by the electrical node between the back control gate and the well is always reversed, the diode then insulating the back control gate from the well and from anything that it might contain (other back control gates in particular).

According to a first embodiment represented in FIG. 3h, the back control gate 36, 37 extends under the entire width of the well 32, 33. In this particular case, the insulating trench 35 insulates the back control gates 37, 38 from one another.

According to another embodiment represented in FIG. 3g, the back control gate 34, 35 is localized in such a way as to extend only over a portion of the width of the well 32, 33. It will be noted that an insulating trench can also be provided when the back control gate is localized, by thus contributing to the insulation of the wells.

According to a variant embodiment that is not represented, a second insulating layer, arranged in the base substrate below the insulating BOX layer, can wholly or partly contribute to insulating a back control gate from the base substrate.

Starting from the structure represented in FIG. 3f (respectively FIG. 3g and FIG. 3h), the mesas are then filled, and, where appropriate, the insulating trenches are also filled, by deposition of a dielectric. This filling implements standard passivation treatments of the side walls, filling and surface planarization.

One or more transistors (of the same type) can then be formed in each of the regions of the thin film 30 delimited by the insulating regions 39 formed by the duly deposited dielectric.

It will have been understood from the foregoing that the invention provides for a flash memory cell that has an individualized back control gate. At the very least, only the cells arranged along one and the same row or one and the same column of the memory array share the same back control gate. A back gate line is thus coupled to the back control gate of each of the cells along a row or a column.

In a manner that is known in the art, a word line is coupled to the front control gate of each of the cells along a column of the memory array. Preferentially, provision is made for the back gate line to extend in parallel to the word line (the back control gate effectively assisting the front control gate during programming).

Figure 4:
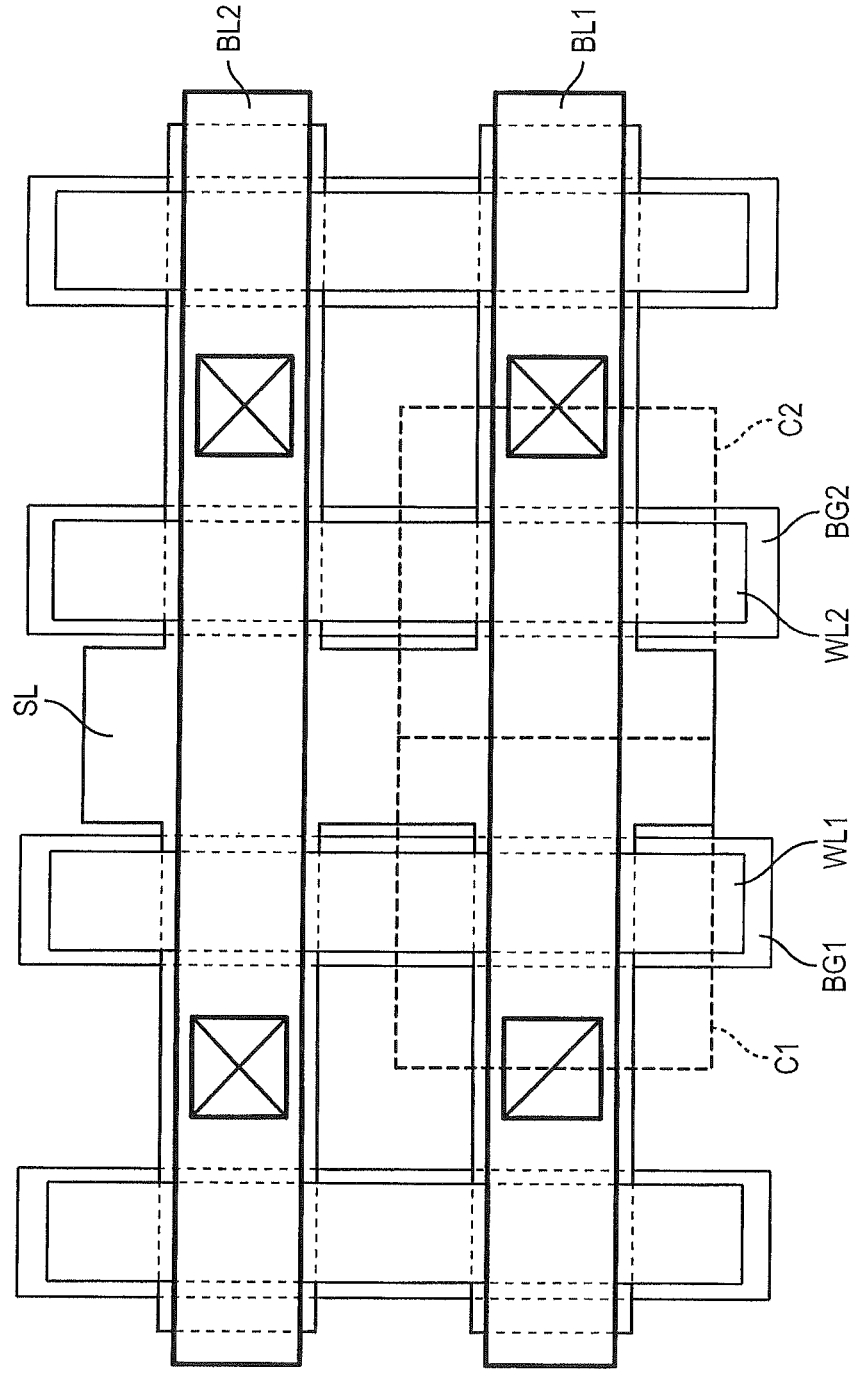
FIG. 4 represents a topology of a memory array according to a preferred embodiment of the invention.

FIG. 4 shows a topology of a memory array conforming to a preferred embodiment of the invention. In this figure, the dotted lines identify two adjacent memory cells C1 and C2, as described previously. Also shown are the various access or control lines to the different regions of the transistors: source line SL linking the source regions S of each of the transistors, bit lines BL1, BL2 used to address the drain region of each of the transistors, word line WL1, WL2 linking the front control gate of each of the transistors, back gate lines BG1, BG2 used to address the back control gate of each of the transistors. In the preferred embodiment illustrated by this FIG. 4, the back control gate BG1, BG2 associated with a memory cell C1-C2 extends in parallel with the word line WL1, WL2 coupled to the front control gate of the transistor forming the memory cell.

In the context of the invention, the individualized back control gate is used dynamically: the voltage that is applied to it is effectively modulated according to the type of cell control operations (programming, erasure, read, hold).

According to a preferred embodiment, the back control gate voltage is positive for programming (which means that the programming voltage that has to be applied to the front control gate can be reduced) and zero for the other operations.

As a variant, the voltage applied to the back control gate can be negative in a hold operation, to allow for a better retention of the charges in the floating gate.

The invention is also advantageous in that it makes it possible to fabricate easily on one and the same substrate both flash-type memory cells and DRAM-type memory cells with floating channel (DRAM being the acronym for "Dynamic Random Access Memory").

Referring to FIGS. 1 and 2, the elimination of the inter-gate oxide layer 13, 23, or more directly the joining of the floating gate 10, 20 and the front control gate 12, 22 in a single control gate makes it possible to change effectively from a flash memory cell to a DRAM memory cell in which the floating channel 4 can accumulate charges.

It will be noted that the back control gate is also advantageous for a DRAM memory cell in that it makes it possible to modify the effective threshold voltage. An appropriate control of the back control gate thus makes it possible to reduce the effective threshold voltage (for example, a positive voltage applied to a back control gate with no working function), which makes it possible to increase the conduction current, advantageously in operations in which the circuit has to be as powerful as possible. The effective threshold voltage can also be increased (via a negative voltage applied to a back control gate with no working function), which makes it possible to reduce the leaks, advantageously in a globally inactive state of the circuit.

The invention thus extends to a method of fabricating a hybrid memory array comprising a first set of flash memory cells and a second set of DRAM memory cells, where the method comprises more specifically a first series of steps common to both first and second sets of memory cells, comprising, for each cell, the formation of a trench in the thin film, the coating of the walls of the trench by the gate dielectric layer, the filling of the trench with a gate material, where the said first series of steps are followed by the formation of the inter-gate dielectric layer on the trench and the formation of the front control gate on the inter-gate dielectric layer so as to form flash memory cells with a floating gate, for each of the memory cells of the first set. For each of the memory cells of the second set, the said first series of steps are followed by the formation of a control gate directly on the trench, so as to form DRAM memory cells with a floating channel instead of a floating gate.

It will also be noted that the back control gate of a flash cell according to the first aspect of the invention can also be used as DRAM cell control gate, the channel 4 then forming a floating channel for the DRAM cell. A hybrid memory cell is thus formed, comprising a flash cell on the front face and a DRAM cell on the back face.

It is to be understood that some or all of the above described features and steps can be combined in different ways, and other variations and modifications will be apparent to those of ordinary skill in the art. It is intended that all of these embodiments, examples, variations and modifications thereon are meant to be encompassed within the spirit and scope of the present invention as set forth in the following claims.

What is claimed is:

1. A flash memory cell comprising:
   an insulating layer on a base substrate;
   a thin film layer of semiconductor material on the insulating layer to form a semiconductor-on-insulator substrate;
   a channel in the thin film layer, wherein the channel forms part of a field effect transistor (FET);
   a gate dielectric layer embedded in the channel;
   a floating gate on the gate dielectric layer;
   an inter-gate dielectric layer on the floating gate;
   a front control gate on the inter-gate dielectric layer above the floating gate and separated therefrom by the inter-gate dielectric; and
   a back control gate within the base substrate directly under and adjacent the insulating layer.

2. The memory cell according to claim 1, wherein the back control gate extends under the entire width of the memory cell.

3. The memory cell according to claim 1, wherein the back control gate is located in such a way as to extend only facing the floating gate.

4. The memory cell according to claim 1, wherein the polarity of the back control gate is of the same type as the channel of the FET.

5. The memory cell according to claim 1, wherein the back control gate is insulated in the base substrate by a well of opposite bias.

6. The memory cell according to claim 1, wherein the insulating layer is a $SiO_2$ buried oxide (BOX) layer.

7. The memory cell according to claim 1, wherein the insulating layer comprises a layer of $Si_3N_4$ sandwiched between two layers of $SiO_2$.

8. The memory cell according to claim 1, which further comprises a source region and a drain region in the thin film layer.

9. The memory cell according to claim 1, wherein the channel of the FET is fully depleted.

10. The memory cell according to claim 1, wherein the gate dielectric layer is embedded in a trench formed within the channel, and is formed on the walls of the trench, and the floating gate is formed in the trench on the gate dielectric layer, so as to be isolated from the channel.

11. The memory cell according to claim 10, which further comprises a source region and a drain region in the thin film layer that are arranged asymmetrically on either side of the floating gate formed in the trench, so that the drain region is closer to the floating gate than is the source region.

12. An array of memory cells having a structure according to claim 1, wherein a plurality of memory cells are arranged in rows and in columns, and in which a back gate line is coupled to the back control gate of each of the cells along a row or a column.

13. The array of memory cells according to claim 12, wherein a word line is coupled to the front control gate of each of the plurality of memory cells along a column, and in which the back gate line extends parallel to the word line.

14. The array of memory cells according to claim 12, wherein a first subset of the plurality of memory cells are FET memory cells having fully depleted channels, and a second subset of memory cells are DRAM memory cells with floating channels and control gates recessed in the channel.

15. The array of memory cells according to claim 12, which further comprises a source region and a drain region in the thin film layer wherein the source region is shared between two adjacent memory cells along either a row or a column within the array.

16. A method of controlling a flash memory cell according to claim 1, in which, during a cell programming operation, the front control gate and the back control gate are used in combination by applying a first positive voltage to the front control gate and a second positive voltage to the back control gate, such that the first voltage is less than the voltage needed to program the cell when no voltage is applied to the back control gate.

17. A method of fabricating a flash memory cell comprising:
  forming an insulating layer on a base substrate;
  forming a thin film layer of semiconductor material on the insulating layer to form a semiconductor-on-insulator substrate;
  forming a channel in the thin film layer, wherein the channel forms part of a field effect transistor (FET);
  forming a gate dielectric layer embedded in the channel;
  forming a floating gate on the gate dielectric layer;
  forming an inter-gate dielectric layer on the floating gate to thereby electrically isolate the floating gate;
  forming a front control gate on the inter-gate dielectric layer above the floating gate and separated therefrom by the inter-gate dielectric; and
  forming a back control gate within the base substrate directly under and adjacent the insulating layer, wherein the front and back control gates are designed to be used in combination to perform a cell programming operation.

* * * * *